US005969644A

United States Patent [19]

Koutaka

[11] Patent Number: 5,969,644

[45] **Date of Patent: *Oct. 19, 1999**

[54] KEYBOARD

[75] Inventor: Yoshirou Koutaka, Fukushima-ken, Japan

[73] Assignee: Alps Electric Co., Ltd., Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/743,865

[22] Filed: Nov. 5, 1996

[30] Foreign Application Priority Data

Nov. 13, 1995 [JP] Japan .................................... 7-318630

[51] Int. Cl.$^{6}$ ...................................................... H03K 17/94

[52] U.S. Cl. ............................. 341/22; 400/472; 345/168

[58] Field of Search .................................. 341/20, 21, 22; 400/472; 345/168; 364/708.1

[56] References Cited

U.S. PATENT DOCUMENTS

| | | | |
|---|---|---|---|
| Re. 32,977 | 7/1989 | Gotoh et al. | 200/5 A |
| 4,560,845 | 12/1985 | Takamura et al. | 200/5 A |
| 4,605,828 | 8/1986 | Gostomski, Jr. et al. | 200/5 A |
| 4,701,579 | 10/1987 | Kurachi et al. | 200/5 A |
| 4,760,217 | 7/1988 | Suzuki et al. | 200/5 A |
| 4,876,415 | 10/1989 | Clancy | 200/5 A |
| 5,490,037 | 2/1996 | Clancy | 361/680 |
| 5,535,091 | 7/1996 | Lee | 400/472 |
| 5,608,603 | 3/1997 | Su | 400/472 |

*Primary Examiner*—Michael Horabik
*Assistant Examiner*—Timothy Edwards, Jr.
*Attorney, Agent, or Firm*—Brinks Hofer Gilson & Lione

[57] ABSTRACT

A keyboard has an upper case, a lower case, and a stacked functional structure formed by stacking and fastening together a membrane switch sheet, a rubber sheet and a housing supporting keys in that order on a curved plate and a flat plate. When assembling the stacked functional structure, the membrane switch sheet and the rubber sheet are placed in that order on the curved plate and the flat plate supported in place on the bottom wall of the lower case and support ribs formed on the inner surface of the bottom wall of the lower case, connecting hooks formed integrally with the housing are inserted through aligned slots formed in the rubber sheet, the membrane switch sheet, the curved plate and the flat plate so that the connecting hooks engage with the lower surfaces of the curved plate and the flat plate with the membrane switch sheet and the rubber sheet are sandwiched firmly between the housing, and the curved plate and the flat plate. The stacked functional structure is sandwiched between the upper and the lower case, and then the upper and the lower case are fastened together to complete the keyboard.

6 Claims, 9 Drawing Sheets

KEYBOARD

BACKGROUND OF THE INVENTION

1. Field of the Invention

The present invention relates to a keyboard to be employed in giving signals to an electronic apparatus or the like.

2. Description of the Related Art

Keyboards are used widely as input devices for operating personal computers, word processors and the like. A conventional keyboard will be described with reference to FIGS. 10 to 14. Referring to FIGS. 10 to 12, the keyboard has a support plate 1 of a metal having a curved portion 1*a*, a bent portion 1*c* and a flat portion 1*b*, a membrane switch sheet 2 having an upper membrane provided with electrodes, and a lower membrane closely spaced from the upper membrane and provided with electrodes, local portions of the upper membrane being depressed to bring the electrodes thereof to be in contact with the corresponding electrodes of the lower membrane for switching operation, keys 4, a rubber sheet 3 for absorbing shocks applied to the keys 4 by operator' fingertips, and a housing 5 of a synthetic resin having an upper surface on which the keys 4 are arranged. The support plate 1, the membrane switch sheet 2, the rubber sheet 3 and the housing 5 are stacked in that order. Those members excluding the support plate 1, i.e., the membrane switch sheet 2, the rubber sheet 3 and the housing 5, have moderate flexibility that enables those members to curve along the curved portion 1*a* of the support plate 1.

The keys 4 arranged on the upper surface of the housing 5 are supported by key support mechanisms 5*a* on the housing 5, respectively, so as to be vertically movable when depressed.

Fastening projections 5*b* project from predetermined positions on the lower surface of the housing 5. As shown in FIGS. 11 and 12, the membrane switch sheet 2 and the rubber sheet 3 are stacked in that order on the support plate 1 having the curved portion 1*a*, the bent portion 1*c* and the flat portion 1*b*. The housing 5 is placed on the rubber sheet 3 so that the projections 5*b* are inserted through aligned holes formed in the rubber sheet 3, the membrane switch sheet 2 and the support plate 1. End portions of the projections 5*b* project from the lower surface of the support plate 1. The end portions of the projections 5*b* are upset to form a stacked functional structure 6 consisting of the support plate 1, the membrane switch sheet 2, the rubber sheet 3 and the housing 5. In this stacked functional structure 6, the membrane switch sheet 2, the rubber sheet 3 and the housing 5 are curved so as to conform to the shape of the support plate 1 having the curved portion 1*a* and the flat portion 1*b*.

In the keyboard provided with the stacked functional structure 6, the curved portion 1*a* of the support plate 1 is seated on the upper surface of the bottom wall 9*a* of a lower case 9 and a rib 9*b* formed on the bottom wall 9*a*. The flat portion 1*b* is seated on ribs 9*c* formed on the bottom wall 9*a* of the lower case 9 as shown in FIG. 10. The stacked functional structure 6 is located on the lower case 9 by projections, not shown, formed on the lower case 9 and engaging with positioning recesses 1*d* (FIG. 14) formed in the support plate 1. An upper case 8 is put on the lower case 9, thus supporting the stacked functional structure 6 so that the keys 4 project outside through holes formed in the upper case 8. The upper case 8 and the lower case 9 sandwiching the stacked functional structure 6 therebetween are fastened together with screws, not shown, to complete the keyboard.

As shown in FIGS. 10 to 12, an alphanumeric key unit A is disposed on the upper surface of the housing 5 with the keys 4 included in the alphanumeric key unit A arranged in a curved arrangement along the curved portion 1*a* of the support plate 1, and a function key unit B is disposed on the upper surface of the housing 5 with the keys 4 included in the function key unit B arranged in a flat arrangement along the flat portion 1*b* of the support plate 1. Since the rear end of the curved portion 1*a* of the support plate 1 is seated on the rib 9*b*, the alphanumeric key unit A rises gradually along the curved portion 1*a* of the support plate 1 toward the rear. Since the function key unit B is disposed behind the alphanumeric key unit A (on the right-had side, in FIG. 10), as viewed from the operator's side and the flat portion 1*b* of the support plate 1 corresponding to the function key unit B are supported on the ribs 9*c*, the function key unit B is disposed in a substantially horizontal position on a level higher than that of the alphanumeric key unit A.

In the conventional keyboard illustrated in FIGS. 10 to 14, the membrane switch sheet 2 and the rubber sheet 3 are stacked on the upper surface of the support plate 1 and holes 1*e* through which the projections 5*b* are inserted are formed in the support plate 1, the membrane switch sheet and the rubber sheet 3 (only the holes 1*e* formed in the support plate 1 are shown) at positions corresponding to the projections 5*b* of the housing 1. The stacked functional structure 6 is fabricated by inserting the projections 5*b* through the holes 1*e* and upsetting the end portions of the projections 5*b* projecting from the lower surface of the support plate 1 to hold the membrane switch sheet 2 and the rubbers sheet 3 between the support plate 1 and the housing 5.

Although the support plate 1 has the curved portion 1*a* and the flat portion 1*b* respectively having different shapes on the opposite sides of the bent portion 1*c*, the housing 5 formed of a flexible synthetic resin is bent substantially along the bent portion 1*c* of the support plate 1 and substantially conforms to the shape of the support plate 1 when the stacked functional structure 6 is completed. The housing 5 has a linear bending portion 5*d* corresponding to the bent portion 1*c* of the support plate 1 and is capable of being bent along the bending portion 5*d* when fastened to the support plate 1.

As shown in FIG. 13, housing 5 is fastened to the support plate 1 with its first portion A1, in which the alphanumeric key unit A is disposed, in conformance to the curved portion 1*a* and its second portion B1, in which the function key unit B is disposed, in conformance to the flat portion 1*b*. The keys 4 which are more frequently used among those of the alphanumeric key unit A, corresponding to the curved portion 1*a* of the support plate 1, are arranged at positions nearer to the operator in the curved first portion A1 than those which are less frequently used to facilitate operator's operation for operating the keys and to reduce load on the operator. The keys 4 of the function key unit B, which are less frequently used than the alphanumeric keys 4, are disposed in the flat second portion B1 remote from the operator to form the keyboard in a small thickness.

The support plate 1 having the curved portion 1*a* and the flat portion 1*b* of the conventional keyboard thus constructed is formed by processing a large metal sheet by a pressing process or a roll-bending process. The yield of such a process is low and hence the cost of the support plate 1 manufactured by such a process is high.

It is very difficult to form the support plate 1 having the curved portion 1*a* and the flat portion 1*b* on the opposite sides of the bent portion 1*c* in a high accuracy by a press or a bending roll because of the springback of the metal sheet. If the support plate 1 is not formed accurately is design dimensions, the stacked functional structure 6 cannot stably be seated on the bottom wall 9*a* and the ribs 9*b* and 9*c* of the lower case 9 and rattles, which makes work for assembling the keyboard difficult.

The stacked functional structure 6 is constructed by stacking the membrane switch sheet 2 and the rubber sheet 3 on the support plate 1, the housing is put on the rubber sheet 3 so that the projections 5*b* are inserted through the holes formed in the support plate 1, the membrane switch sheet 2 and the rubber sheet 3, and the end portions of the projections 5*b* are upset. Since the number of the projections 5*b* is relatively large, it is very difficult to upset all the fastening projections 5*b* uniformly so that the curved portion 5*a* and the flat portion 5*b* of the housing 5 are fastened equally to the support plate 1. Furthermore, an expensive, large upsetting machine is necessary to upset the fastening projections 5*b* so that the curved portion 5*a* and the flat portion 5*b* are fastened equally to the support plate 1. Such problems may be solved by individually upsetting the plurality of fastening projections 5*b* on at a time, which, however, takes much time.

SUMMARY OF THE INVENTION

According to a first aspect of the present invention, a keyboard comprises a case, a plurality of plates supported in place in the case, a membrane switch sheet placed on the plurality of plates, and a housing supporting keys and mounted on the membrane switch sheet.

In this keyboard, the plurality of plates may be mounted on the case with a space therebetween, the plurality of plates may be extended in different planes, respectively, and the membrane switch sheet may be bent in a portion thereof corresponding to the space between the plates.

In this keyboard, some of the plurality of plates may be formed in curved shapes and the rest may be formed in flat shapes.

According to a second aspect of the present invention, a keyboard comprises a case, a plurality of plates supported in place in the case and having hook retaining portion, a membrane switch sheet put on the plurality of plates, a housing supporting keys and mounted on the membrane switch sheet, hooks provided on the inner surface of the housing. The hooks are brought into engagement with the hook retaining portions of the plurality of plates to connect the housing to the plurality of plates.

BRIEF DESCRIPTION OF THE DRAWINGS

The above and other objects, features and advantages of the present invention will become apparent from the ensuing description taken in connection with the accompanying drawings, in which.

DETAILED DESCRIPTION OF THE PREFERRED EMBODIMENTS

Figure 1:
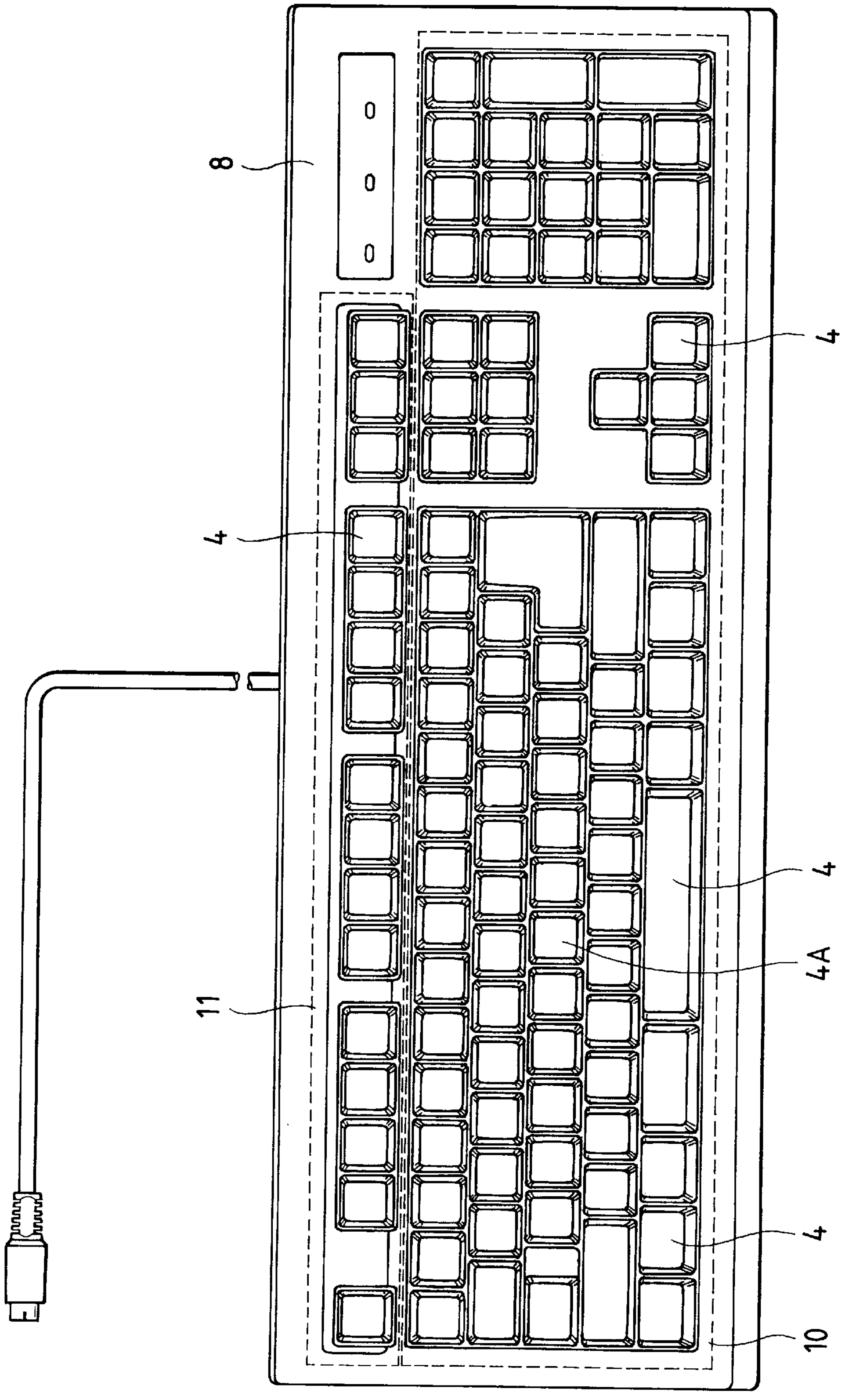
FIG. 1 is a front view of a keyboard in a preferred embodiment according to the present invention.
Figure 2:
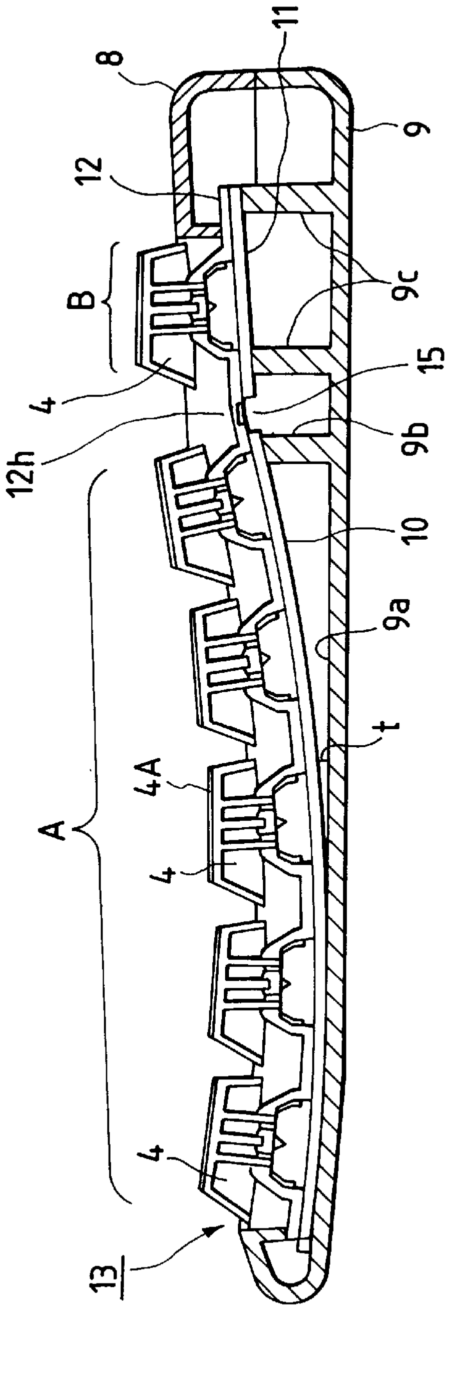
FIG. 2 is a sectional view of an essential portion of the keyboard of FIG. 1.

Referring to FIGS. 1 to 9 showing a keyboard in a preferred embodiment according to the present invention, the keyboard has a curved plate 10 of a metal curved in an arc of a circle with a radius of curvature of 200 mm or above and a flat plate 11 of a metal. A stacked functional structure 13 is formed by stacking a membrane switch sheet 2, a rubber sheet 3, and a housing 12 of a synthetic resin supporting a plurality of keys 4 to be operated by operator's fingertips for information feeding in that order on the plates 10 and 11. The stacked functional structure 13 is held between cases 8 and 9.

The components of the stacked functional structure 13 excluding the plates 10 and 11, similarly to those of the foregoing conventional keyboard, are moderately flexible and can be bent at angles below a certain limit angle.

The housing 12 is provided on its upper surface with key supports 12*a*. The keys 4 are supported on the key supports 12*a* so as to be vertically movable when depressed by the operator's fingertips. The number of the key supports 12*a* is equal to that of the keys 4.

Figure 7:
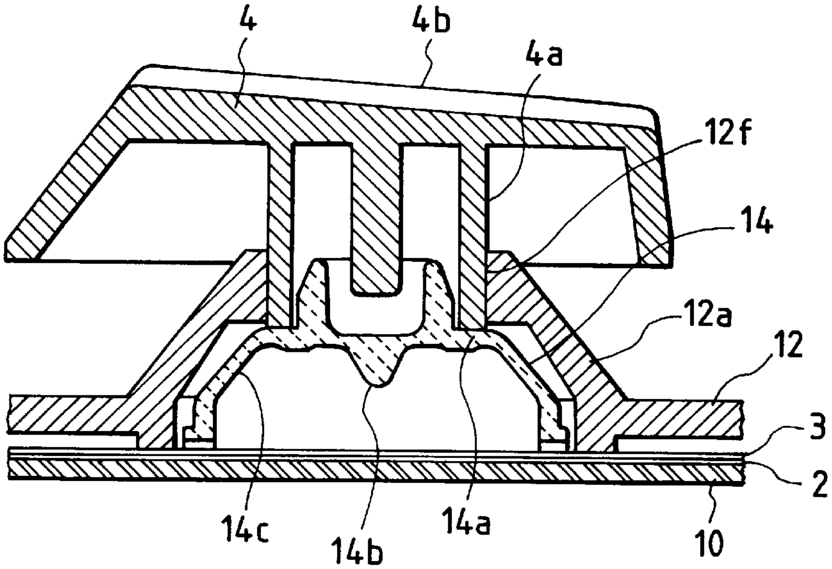
FIG. 7 is a fragmentary sectional view of a key and a housing included in the keyboard of FIG. 1.

As shown in FIG. 7, each key 4 has a key top 4*b* and a stem 4*a* and is supported on the housing 12. Substantially hemispherical, hollow key supports 12*a* respectively provided with stem guide holes 12*f* protrude from the upper surface of the housing 12. An elastic rubber spring 14 placed in the hollow of each key support 12*a*. The rubber spring 14 has a top wall 14*a*, a projection 14*b* and a domelike side wall 14*c*.

The operation of the key 4 will be described hereinafter. The key 4 is supported for vertical movement on the key support 12*a* with the stem 4*a* thereof fitted in the stem guide hole 12*f*. When depressed by the operator's fingertip, the stem 4*a* depresses the top wall 14*a* of the rubber spring 14. Consequently the side wall 14*c* is elastically deformed and the projection 14*b* pushes the membrane switch sheet 2 underlying the rubber sheet 3 to close a corresponding membrane switch. When the pressure applied to the key 4 by the operator's fingertip is removed from the key 4, the resilience of the elastically deformed side wall 14*c* pushes up the stem 4*a* and the rubber spring 14 restores its domelike original shape to return the key 4 to its initial position.

The membrane switch sheet 2 has an upper membrane provided with electrodes, and a lower membrane closely spaced from the upper membrane and provided with electrodes. When a local portion of the upper membrane is depressed, the electrode of the upper membrane is brought into contact with the corresponding electrode of the lower membrane for switch closing operation. The rubber sheet 3 has an elasticity capable of absorbing shocks applied to the key 4 by the operator's fingertip.

Figure 4:
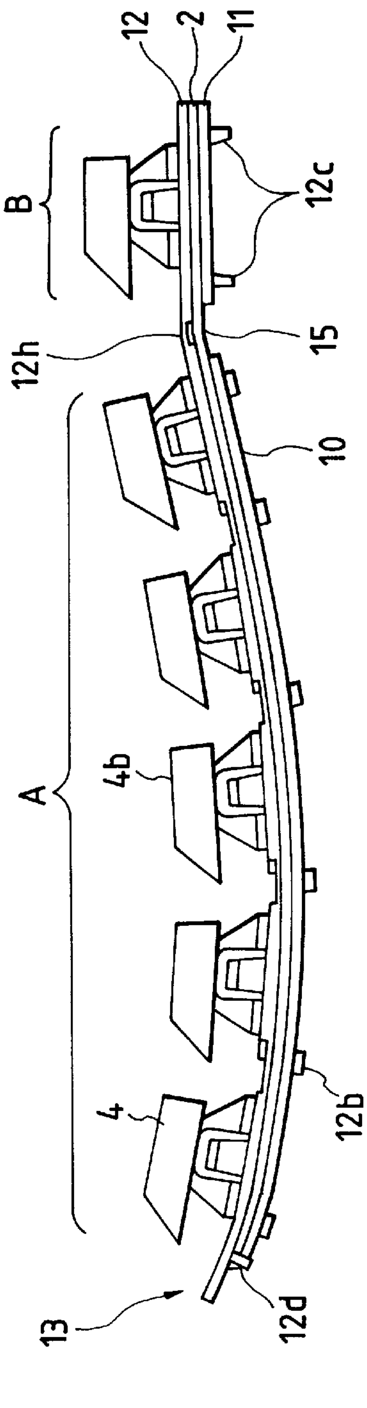
FIG. 4 is a side view of the stacked functional structure of FIG. 3.
Figure 3:
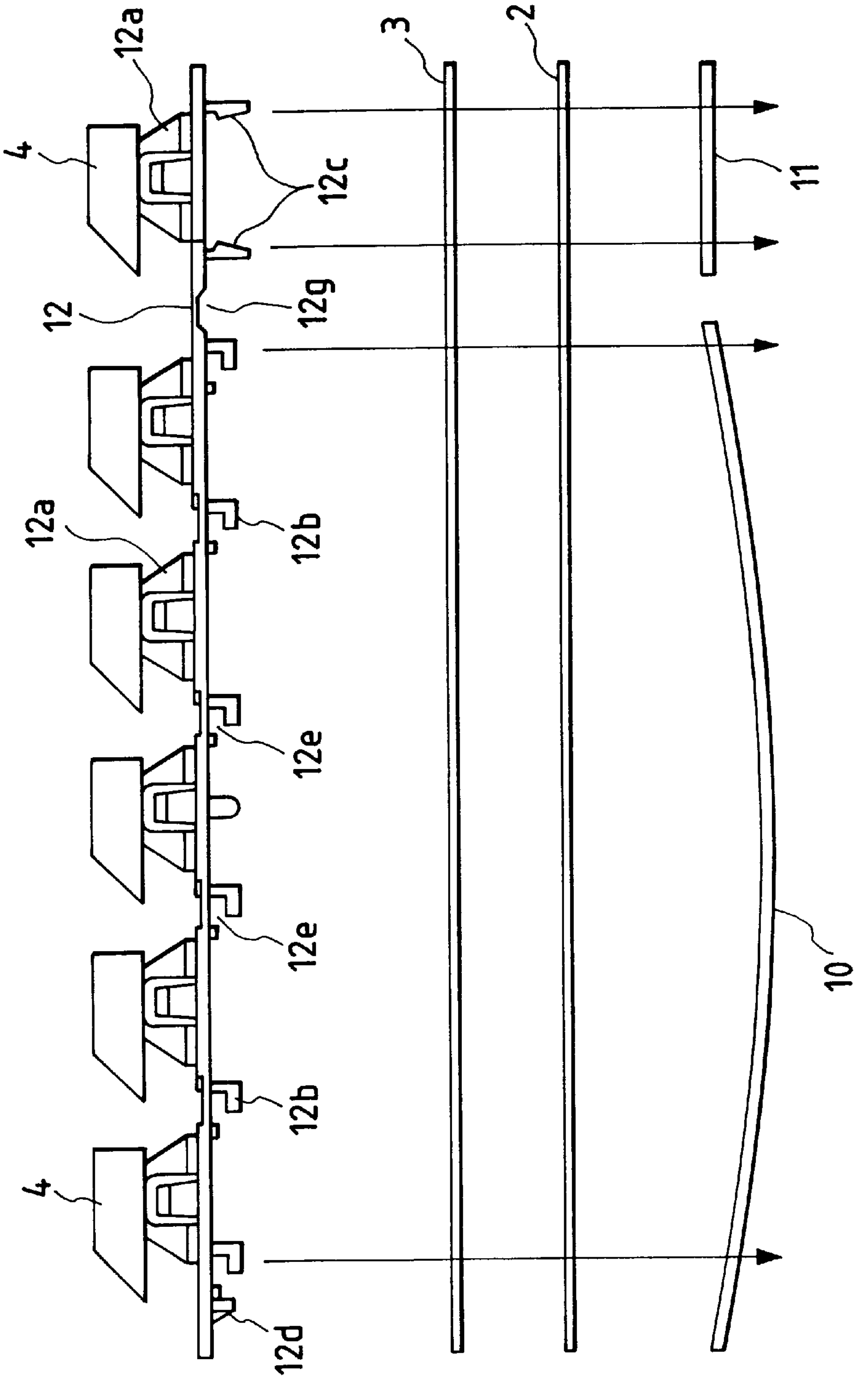
FIG. 3 is an exploded side view of a stacked functional structure included in the keyboard of FIG. 1.
Figure 5:
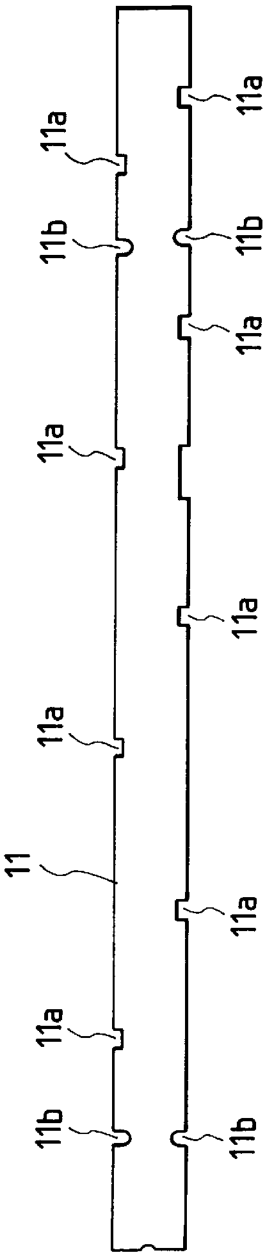
FIG. 5 is a front view of a flat plate included in the keyboard of FIG. 1.
Figure 6:
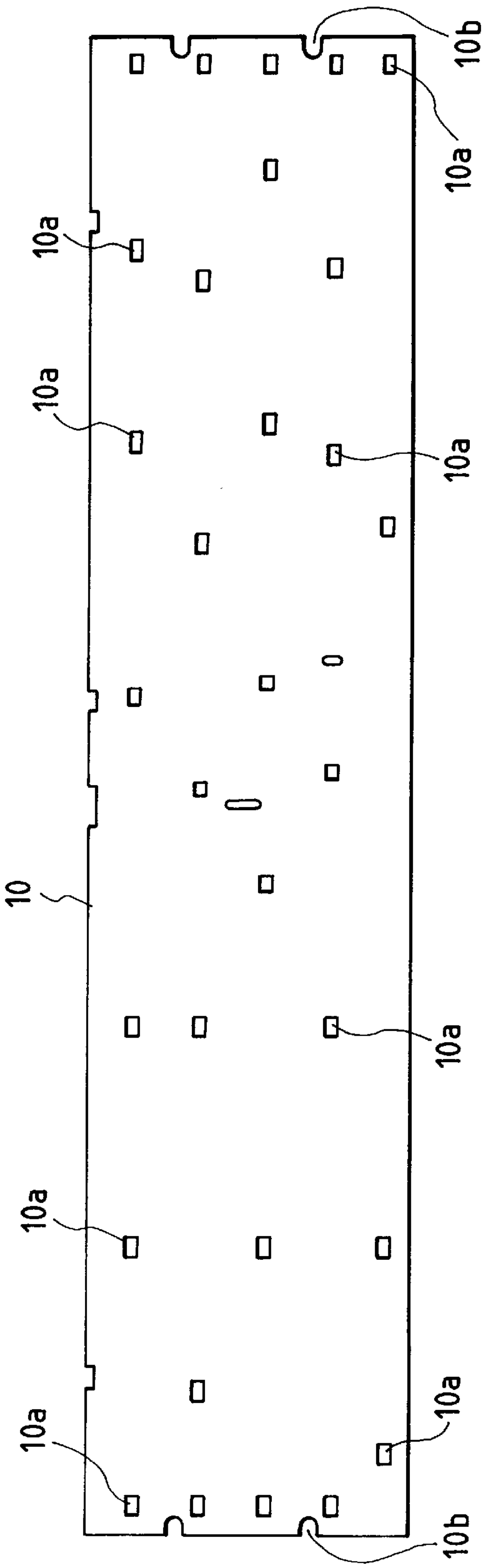
FIG. 6 is a front view of a curved plate included in the keyboard of FIG. 1.

A plurality of L-shaped hooks 12*b* and a plurality of bill-shaped hooks 12*c* are formed on the inner surface of the housing 12 supporting the keys 4 as shown in FIG. 3. As shown in FIGS. 3 and 4, the membrane switch sheet 2 and the rubber sheet 3 are stacked on the curved plate 10 and the flat plate 11, and the housing 12 is put on the rubber sheet 3. Slots 11*a* are formed in the flat plate 11, the membrane switch sheet 2 and the rubber sheet 3 at positions respectively corresponding to the bill-shaped hooks 12*c*,and slots 10*a* are formed in the curved plate 10, the membrane switch sheet 2 and the rubber sheet 3 at positions respectively corresponding to the L-shaped hooks 12*b*. The slots 10*a* are formed in a size that secures a small clearance between the L-shaped hook 12*b* and the curved plate 10, the membrane switch sheet 2 and the rubber sheet 3.

When connecting the flat plate 11 to the housing 12, the bill-shaped hooks 12*c* are inserted through the slots 11*a* of the rubber sheet 3, the membrane switch sheet 2 and the flat plate 11, and are brought into snapping engagement with the edges of the slots 11*a* of the flat plate 11. Thus a function key unit B is formed.

Figure 8:
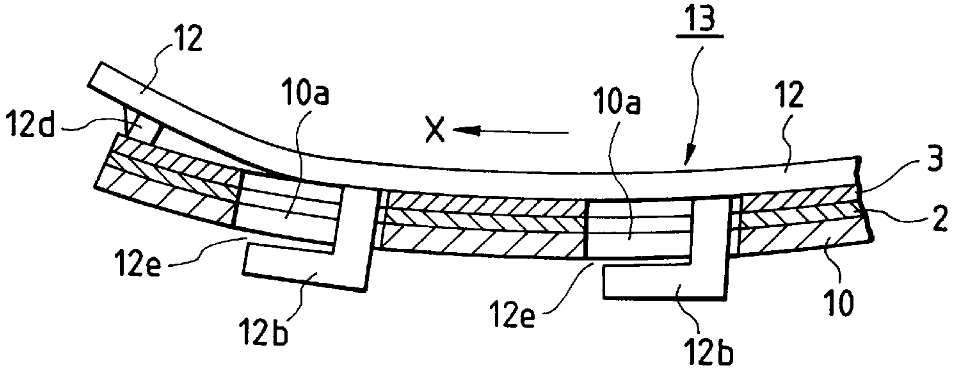
FIG. 8 is a sectional view of assistance in explaining a method of assembling the stacked functional structure of FIG. 4.
Figure 9:
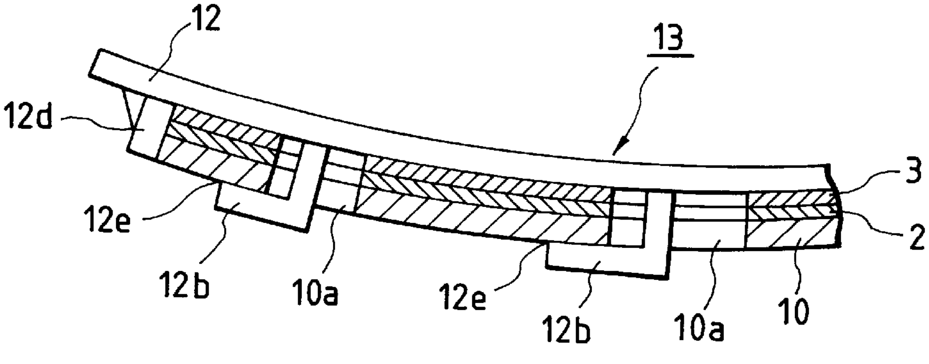
FIG. 9 is a sectional view of assistance in explaining a method of assembling the stacked functional structure of FIG. 4.
Figure 10:
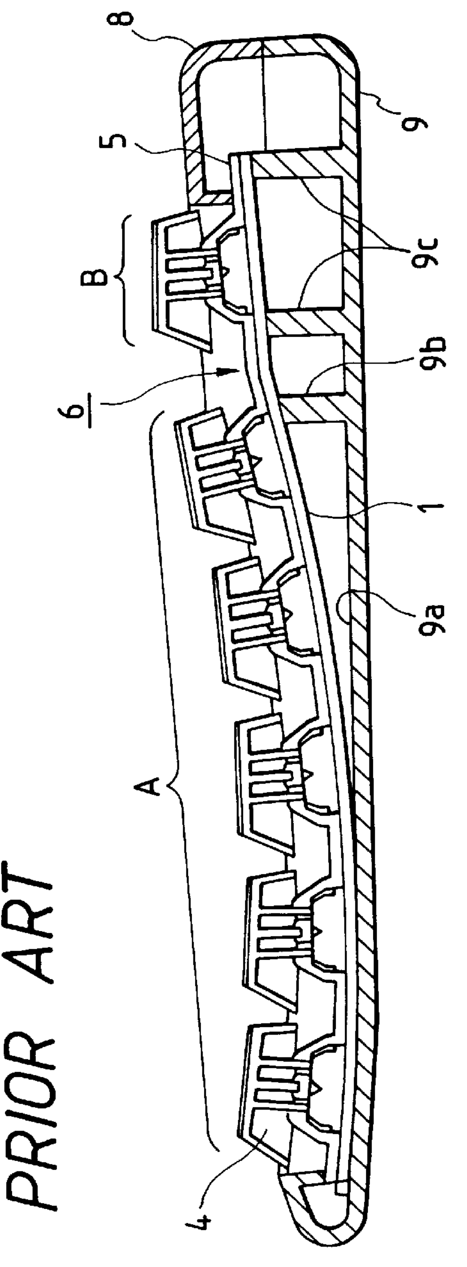
FIG. 10 PRIOR ART
FIG. 10 is a sectional view of an essential portion of a conventional keyboard.
Figure 12:
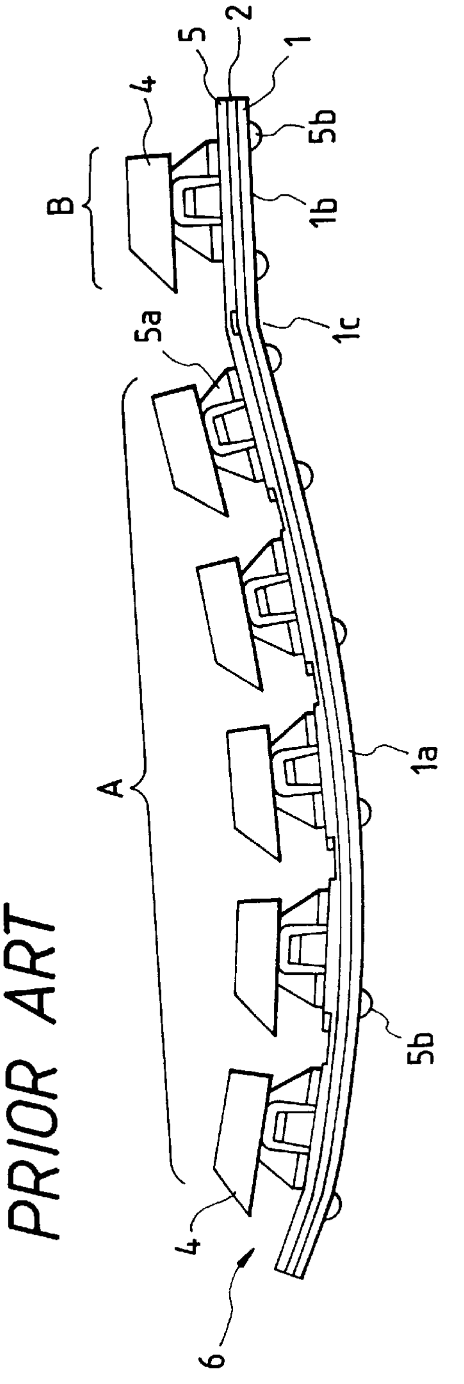
FIG. 12 PRIOR ART
FIG. 12 is a side view of the stacked functional structure of FIG. 10.
Figure 11:
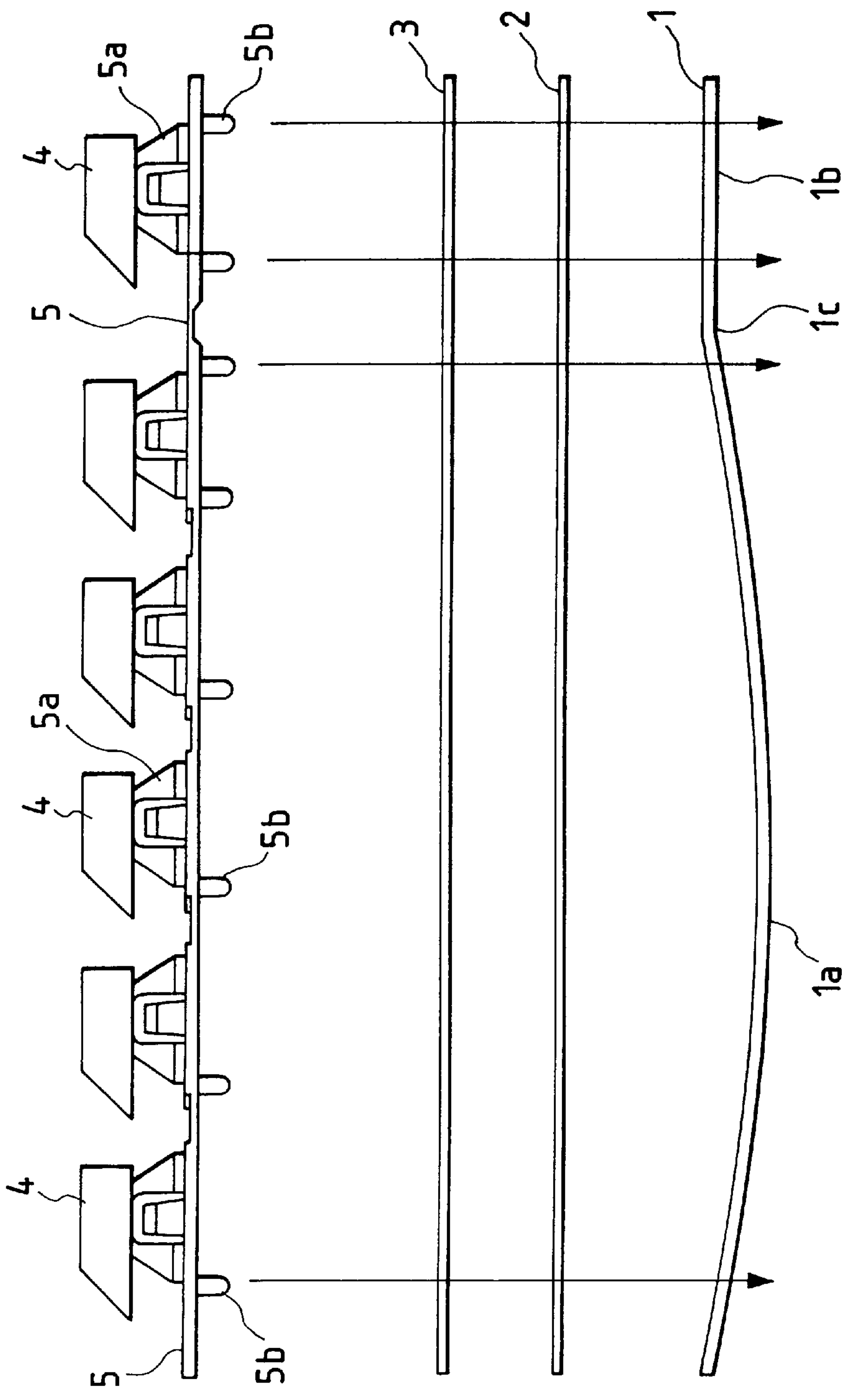
FIG. 11 PRIOR ART
FIG. 11 is an exploded side view of a stacked functional structure included in the keyboard of FIG. 10.
Figure 13:
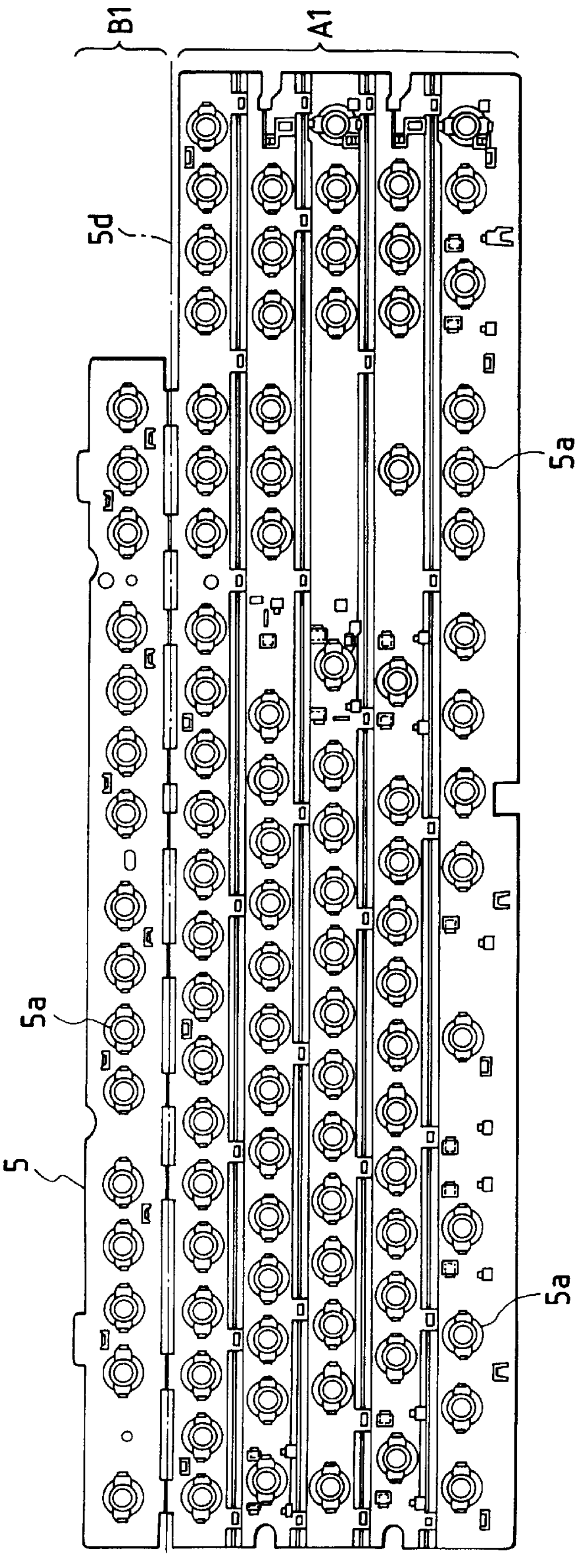
FIG. 13 PRIOR ART
FIG. 13 is a front view of a housing included in the keyboard of FIG. 10.
Figure 14:
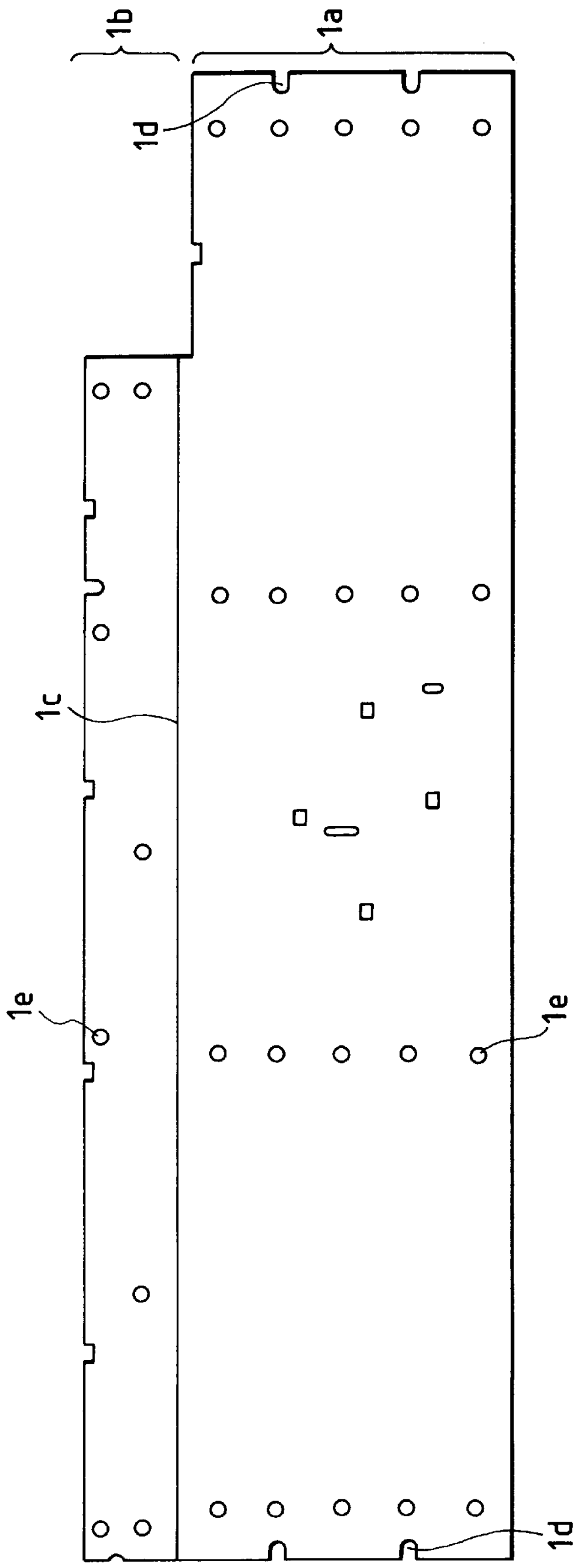
FIG. 14 PRIOR ART
FIG. 14 is a front view of a support plate included in the keyboard of FIG. 10.

When connecting the curved plate 10 to the housing 12, the L-shaped hooks 12*b* are inserted through the slots 10*a* of the rubber sheet 3, the membrane switch sheet 2 and the curved plate 10 as shown in FIG. 8, and then the housing 12 is forced to move along the rubber sheet 3 in the direction of the arrow X to bring the L-shaped hook 12*b* into engagement with the edges of the slots 10*a* of the curved plate 10 as shown in FIG. 9. Thus an alphanumeric key unit A is formed. When the alphanumeric key unit A and the function key unit B are thus formed, a gap 15 is formed between the plates 10 and 11 as shown in FIG. 4.

The stacked functional structure 13 is mounted to the lower case 9 with the housing 12 bent along its bending portion 12*h* corresponding to the gap 15. A groove 12*g* is formed in the bending portion 12*h* to form the bending portion 12*h* in a small thickness so that the housing 12 can easily be bent along the bending portion 12*h*.

A method of assembling the keyboard will be described hereinafter. The curved plate 10 is seated on the bottom wall 9*a* of the lower case 9, and a rib 9*b* formed on the bottom wall 9*a*. The curved plate 10 is located by fitting locating lugs, not shown, formed on the lower case 9 in locating recesses 10*b* formed in the curved plate 10 and held temporarily in place on the lower case 9. A front portion, i.e., a portion on the side of the operator, of the curved plate 10 is placed in contact with the bottom wall 9*a*, and a rear portion of the same is seated on the rib 9*b*. In this stage, a space t of a small width, for example, about 3 mm, is formed between a portion of the curved plate 10 corresponding to home position keys 4A and the bottom wall 9*a* of the lower case 9. Since the width of the space t is small, the home position keys 4A are at a low height, which enables the operator to operate the keys 4 in a natural mode. If the curved plate 10 is extended to the rear end of the lower case 9, the rear portion of the curved plate 10 rises high because the space t is small. Therefore the flat plate 11 separated from the curved plate 10 is used for forming the function key unit B to form the keyboard in a small thickness.

Subsequently, the flat plate 11 is placed on two ribs 9*c* formed on the bottom wall 9*a* of the lower case 9. The flat plate 11, similarly to the curved plate 10, is located by fitting locating lugs, not shown, formed on the lower case 9 in locating recesses 11*b* formed in the flat plate 11 and held temporarily in place on the lower case 9. Then, the membrane switch sheet 2 and the rubber sheet 3 are stacked on the plates 10 and 11, and the housing 12 supporting the keys 4 is placed on the rubber sheet 3 to construct the stacked functional structure 13. The stacked functional structure 1 thus mounted on the lower case 9 is bent along a portion corresponding to the bending portion 12*h* of the housing 12.

When connecting the plates 10 and 11, the key tops 4*b* of the keys 4 of the alphanumeric key unit A are depressed by a jig, not shown, having a curved working surface conforming to the shape of the curved plate 10 and, at the same time, the key tops 4*b* of the keys 4 of the function key units B by a jig, not shown, having a flat working surface conforming to the shape of the flat plate 11. Portions of the housing 12, the membrane switch sheet 2 and the rubber sheet 3 corresponding to the curved plate 10 are curved along the curved plate 10 so that the portion of the membrane switch sheet 2 is brought into close contact with the curved plate 10. The L-shaped hooks 12*b* are inserted through the slots 10*a* of the rubber sheet 3, the membrane switch sheet 2 and the curved plate 10 as shown in FIG. 8.

In this state, a stopper 12*d* formed in a front end portion of the housing 12 lies on the rubber sheet 3 and the front end portion is warped upward. Then, the housing 12 is forced to move in the direction of the arrow X relative to the rubber sheet 3. Consequently, the curved plate 10, the membrane switch sheet 2 and the rubber sheet 3 are clamped between housing 12 and the noses 12*e* of the L-shaped hooks 12*b* to complete a portion of the stacked functional structure 13 corresponding to the alphanumeric key unit A. In this state, the stopper 12*d* of the housing 12 in close contact with the front edges of the curved plate 10, the membrane switch sheet 2 and the rubber sheet 3, so that the curved plate 10 is unable to come off the L-shaped hooks 12*b*. Since the housing 12 has a substantially flat original shape and is elastically curved in conformance to the curved shape of the curved plate 10, the housing 12 tends to restore its flat original shape. Therefore, the L-shaped hooks 12*b* are kept in firm engagement with the curved plate 10 by the resilience of the housing 12 and hence the curved plate 10 and the housing 12 are never separated from each other by vibrations or the like. The bill-shaped hooks 12*c* are inserted through the slots 11*a* of the rubber sheet 3, the membrane switch sheet 2 and the flat plate 11, and are brought into snapping engagement with the edges of the slots 11*a* of the flat plate 11. An upper case 8 is put on the lower case 9 so as to sandwich the stacked functional structure 13 between the cases 8 and 9 with the keys 4 exposed on the surface of the upper case 3, and the cases 8 and 9 are fastened together with screws, not shown, to complete the keyboard.

In this keyboard, the plates 10 and 11 are extended in two different planes, respectively, in the lower case 9. The alphanumeric key unit A corresponding to the curved plate 10 is disposed so as to slope gradually up toward the rear, the alphanumeric keys 4 which are more frequently used among those of the alphanumeric key unit A are arranged at positions nearer to the operator than those which are less frequently used and the rear end of the curved plate 10 rests on the rib 9*b*. The function keys 4 of the function key unit B corresponding to the flat plate 11, which are less frequently used than the alphanumeric keys 4, are arranged on a flat plane at positions remote form the operator and the flat plate 11 rests on the ribs 9*c*. The alphanumeric key unit A and the function key unit B may be extended in two flat planes or in two curved planes, respectively, in stead of in the curved plane and the flat plane. Moreover, the two planes may be two stepped horizontal planes instead of the two continuous planes forming a plane having a bent portion.

Since the curved plate 10 and the flat plate 11 are separate members which are formed individually and have simple shapes, respectively, the curved plate 10 and the flat plate 11 can be accurately formed by a mass-production process.

Since the plates 10 and 11 are separate members and the space 15 is secured between the plates 10 and 11 as seated on the ribs 9*b* and 9*c* of the lower case 9, respectively, and the housing 12, the membrane switch sheet 2 and the rubber sheet 3 are flexible, the stacked functional structure 13 can easily be mounted on the ribs 9*b* and 9*c* even if the ribs 9*b* and 9*c* are not formed accurately in design height.

In a modification of the keyboard in this embodiment, the housing 12 may be provided with bill-shaped hooks instead of the L-shaped hooks 12*b*.

The keyboard of the present invention can easily and quickly be assembled without using a large upsetting machine.

What is claimed is:

1. A keyboard comprising:

a curved plate having hook retaining portions, a first end and a second end;

a membrane switch sheet arranged on the curved plate, and having a first end and a second end;

a housing supporting keys, the housing being mounted on the membrane switch sheet;

a stopper, the stopper abutting the first end of the curved plate and the first end of the membrane switch sheet, so as to cause an integration of the housing, the curved plate and the membrane switch sheet; and a plurality of engaging hooks provided on the housing so as to be in engagement with the hook retaining portions of the curved plate;

said plurality of engaging hooks being brought into engagement with the hook retaining portions of the curved plate to connect the housing to the curved plate, whereby the housing and the membrane switch sheet are integrally formed into a shape coinciding with that of the curved plate.

2. A keyboard, comprising:

a lower case having a bottom surface, a plurality of curved plate rib supports formed on the bottom surface, and a plurality of flat plate rib supports formed on the bottom surface, the bottom surface being substantially flat;

a curved plate having a front side and a back side, the front side being fixed adjacent the bottom surface and the back side being fixed to the plurality of curved plate rib supports;

a flat plate having a front side, the flat plate being fixed to the plurality of flat plate rib supports, the front side of the flat plate being adjacent to the back side of the curved plate and separated from the back side of the curved plate by a plate gap;

a resilient housing fixed over the curved plate and the flat plate, the resilient housing conforming in shape to the curved plate and the flat plate, the resilient housing having a plurality of key switches; and a membrane switch sheet placed over the curved plate and the flat plate such that the curved plate and the resilient housing are separated by the membrane switch sheet and the flat plate and the resilient housing are separated by the membrane switch sheet.

3. A keyboard according to claim 2, wherein a group of alpha-numeric keys are arranged on the resilient housing over the curved plate and a group of function keys are arranged on the resilient housing over the flat plate.

4. A keyboard according to claim 2, wherein:

the curved plate includes a plurality of curved plate hook retaining portions;

the flat plate includes a plurality of flat plate hood retaining portions;

the resilient housing has a plurality of curved plate engaging hooks, the plurality of curved plate engaging hooks being brought into engagement with the plurality of curved plate hook retaining portions; and the resilient housing has a plurality of flat plate engaging hooks, the plurality of flat plate engaging hooks being brought into engagement with the plurality of flat plate retaining portions.

5. A keyboard according to claim 4, wherein:

each of the plurality of curved plate hooks are L-shaped engaging hooks; and each of the plurality of flat plate engaging hooks are bill-shaped engaging hooks.

6. A keyboard according to claim 4, wherein:

each of the plurality of curved plate engaging hooks are bill-shaped engaging hooks; and each of the plurality of flat plate engaging hooks are bill-shaped engaging hooks.

* * * * *

UNITED STATES PATENT AND TRADEMARK OFFICE

CERTIFICATE OF CORRECTION

PATENT NO. : 5,969,644
DATED : October 19, 1999
INVENTOR(S) : Yoshirou Koutaka

It is certified that error appears in the above-indentified patent and that said Letters Patent is hereby corrected as shown below:

In the Claims

In claim 5, line 2, after "plate" insert --engaging--.

Signed and Sealed this

Eighth Day of August, 2000

Attest:

Q. TODD DICKINSON

Attesting Officer

Director of Patents and Trademarks